United States Patent
Yokoyama

(10) Patent No.: US 10,091,914 B2
(45) Date of Patent: Oct. 2, 2018

(54) FAN CONTROL DEVICE

(71) Applicant: NEC Corporation, Minato-ku, Tokyo (JP)

(72) Inventor: Jun Yokoyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 569 days.

(21) Appl. No.: 14/096,553

(22) Filed: Dec. 4, 2013

(65) Prior Publication Data

US 2014/0159634 A1   Jun. 12, 2014

(30) Foreign Application Priority Data

Dec. 10, 2012 (JP) ................................ 2012-269142

(51) Int. Cl.
*H05K 7/20* (2006.01)

(52) U.S. Cl.
CPC ................. *H05K 7/20836* (2013.01)

(58) Field of Classification Search
CPC .............................. H05K 7/20836; H05K 7/20
USPC ........................................................ 318/471
See application file for complete search history.

(56) References Cited

U.S. PATENT DOCUMENTS

| | | | | |
|---|---|---|---|---|
| 5,544,809 A * | 8/1996 | Keating | ............... | F24F 11/0009 236/44 C |
| 2006/0086112 A1* | 4/2006 | Bloemer | ................. | F24F 3/153 62/176.6 |
| 2008/0178620 A1* | 7/2008 | Yelles | ................ | B60H 1/00785 62/176.2 |
| 2009/0210096 A1* | 8/2009 | Stack | ................... | F24F 11/0009 700/278 |
| 2010/0015906 A1* | 1/2010 | Takahashi | ................. | F24F 7/06 454/258 |
| 2010/0031680 A1* | 2/2010 | Eisenhour | ............ | B60H 1/3207 62/176.1 |
| 2010/0100254 A1* | 4/2010 | Artman | .............. | H05K 7/20836 700/299 |
| 2011/0176275 A1* | 7/2011 | Sato | ........................ | G06F 1/206 361/695 |
| 2011/0264280 A1* | 10/2011 | Grabinger | ............... | F24F 3/044 700/282 |
| 2011/0292601 A1* | 12/2011 | Campbell | ................. | F24F 3/14 361/691 |

(Continued)

FOREIGN PATENT DOCUMENTS

JP   2011-151131 A   8/2011
JP   2011-242011 A   12/2011

*Primary Examiner* — Muhammad S Islam

(57) ABSTRACT

A rotation number deciding unit decides a rotation number of a cooling fan based on the result of detection by an intake air temperature sensor. A determining unit determines whether the degree of increase of intake air temperature is equal to or more than a threshold based on the result of detection by the intake air temperature sensor. When the determining unit determines the degree of increase of intake air temperature is equal to or more than the threshold, the controlling unit determines whether there is a possibility of occurrence of condensation based on the result of detection by the intake air temperature sensor and the result of detection by an intake air humidity sensor. When determining there is a possibility of occurrence of condensation, the controlling means causes the cooling fan to rotate at a rotation number lower than the rotation number decided by the rotation number deciding unit.

4 Claims, 6 Drawing Sheets

(56) References Cited

U.S. PATENT DOCUMENTS

| | | | |
|---|---|---|---|
| 2011/0306288 A1* | 12/2011 | Murayama | F24F 11/0001 454/184 |
| 2012/0234527 A1* | 9/2012 | Murayama | G05D 22/02 165/287 |
| 2013/0014522 A1* | 1/2013 | Lukasse | F25D 17/042 62/93 |
| 2013/0239814 A1* | 9/2013 | Ito | B01D 53/261 96/111 |

* cited by examiner

FAN CONTROL DEVICE

INCORPORATION BY REFERENCE

This application is based upon and claims the benefit of priority from Japanese patent application No. 2012-269142, filed on Dec. 10, 2012, the disclosure of which is incorporated herein in its entirety by reference.

TECHNICAL FIELD

The present invention relates to a fan control device, ICT (Information and Communication Technology) equipment, a fan control method, and a program.

BACKGROUND ART

ICT equipment such as a server device is usually installed in an air-conditioned machine room and operated in a somewhat constant temperature condition (see Patent Document 1). Patent Document 1 discloses a technique of controlling temperature and humidity in a server case for storing a plurality of servers. To be specific, the disclosed technique is a technique of controlling the rotation number of a supply fan that flows the air into the server case, the rotation number of a return fan that flows the air within the server case to the outside, the quantity of control of a cooling coil, the quantity of control of a humidifier, and so on, based on outside air temperature detected by an outside air temperature sensor and outside air humidity detected by an outside air humidity sensor. However, in recent years, for the purpose of reducing the investment cost and operation cost for a machine room, a machine room in which the inside of ICT equipment is cooled down by outside air taken therein draws increasing attention. Because the indoor temperature of a machine room utilizing outside air varies more than that of an air-conditioned machine room, it is desirable to provide ICT equipment with a function of controlling the inside temperature thereof.

ICT equipment having an inside temperature control function is disclosed in Patent Document 2, for example. A server device disclosed in Patent Document 2 includes a cooling fan, an intake air temperature sensor that detects the temperature of intake air, a component temperature sensor that detects the temperature of an electronic component inside the device, and a control part that controls the rotation number of the cooling fan. The control part controls the rotation number of the fan based on the result of detection by the intake air temperature sensor and the result of detection by the component temperature sensor.

To be more specific, until the results of detection by all of the component temperature sensors become equal to or less than a first component temperature threshold, the control part compares the result of detection by the intake air temperature sensor with a plurality of intake air temperature thresholds set in advance, and rotates the cooling fan at the rotation number in accordance with the result of comparison (increases the rotation number as the intake air temperature is higher). When the results of detection by all of the component temperature sensors become equal to or less than the first component temperature threshold, the control part compares the results of detection by the component temperature sensors with second to fourth component temperature thresholds, and controls the rotation number of the cooling fan in the following manner based on the result of comparison.

In a case where the results of detection by all of the component temperature sensors are equal to or less than the second component temperature threshold (first component temperature threshold<second component temperature threshold), the control part gradually decreases the rotation number of the cooling fan. In a case where the results of detection by all of the component temperature sensors are higher than the second component temperature threshold and equal to or less than the third component temperature threshold (second component temperature threshold<third component temperature threshold), the control part keeps the current rotation number. In a case where the results of detection by all of the component temperature sensors are higher than the third component temperature threshold and equal to or less than the fourth component temperature threshold (third component temperature threshold<fourth component temperature threshold), the control part gradually increases the rotation number of the cooling fan. In a case where the results of detection by all of the component temperature sensors exceed the fourth component temperature threshold (third component temperature threshold<fourth component temperature threshold), the control part causes the cooling fan to rotate at a rotation number corresponding to the result of comparison between the result of detection by the intake air temperature sensor and the intake air temperature thresholds set in advance.

Patent Document 1: Japanese Unexamined Patent Application Publication No. JP-A 2011-242011
Patent Document 2: Japanese Unexamined Patent Application Publication No. JP-A 2011-151131

According to the technique disclosed in Patent Document 2, it is possible to cool the inside of ICT equipment without depending on a cooling system. However, because the technique disclosed in Patent Document 2 is designed to increase the rotation number of the cooling fan as intake air temperature becomes higher without considering intake air humidity, there is a fear that condensation occurs on the inner face of a case, the surface of a board, and so on, in a case where the temperature of intake air sharply rises.

SUMMARY

Accordingly, an object of the present invention is to provide a fan control device capable of solving a problem that there is a fear of occurrence of condensation on the inner face of a case, the surface of a board, and so on, in a case where intake air temperature sharply rises.

A fan control device according to the present invention includes:

a rotation number deciding unit for deciding a rotation number of a cooling fan based on a result of detection by an intake air temperature sensor detecting intake air temperature;

a determining unit for determining whether a degree of increase of intake air temperature is equal to or more than a first threshold based on the result of detection by the intake air temperature sensor; and a controlling unit for, in a case where the determining unit determines that the degree of increase of intake air temperature is equal to or more than the first threshold, correcting the rotation number decided by the rotation number deciding unit, based on the result of detection by the intake air temperature sensor and a result of detection by an intake air humidity sensor detecting intake air humidity, and causing the cooling fan to rotate at the corrected rotation number.

ICT equipment according to the present invention includes:

a cooling fan;

an intake temperature sensor detecting intake air temperature;

an intake air humidity sensor detecting intake air humidity;

a rotation number deciding unit for deciding a rotation number of the cooling fan based on a result of detection by the intake air temperature sensor;

a determining unit for determining whether a degree of increase of intake air temperature is equal to or more than a first threshold based on the result of detection by the intake air temperature sensor; and a controlling unit for, in a case where the determining unit determines that the degree of increase of intake air temperature is equal to or more than the first threshold, correcting the rotation number decided by the rotation number deciding unit, based on the result of detection by the intake air temperature sensor and a result of detection by the intake air humidity sensor, and causing the cooling fan to rotate at the corrected rotation number.

A fan control method according to the present invention includes:

deciding a rotation number of a cooling fan based on a result of detection by an intake air temperature sensor detecting intake air temperature, by a rotation number deciding unit;

determining whether a degree of increase of intake air temperature is equal to or more than a first threshold based on the result of detection by the intake air temperature sensor, by a determining unit; and in a case where the determining unit determines that the degree of increase of intake air temperature is equal to or more than the first threshold, correcting the rotation number decided by the rotation number deciding unit, based on the result of detection by the intake air temperature sensor and a result of detection by an intake air humidity sensor detecting intake air humidity, and causing the cooling fan to rotate at the corrected rotation number, by a controlling unit.

A non-transitory computer-readable medium storing a program according to the present invention stores a program including instructions for causing a computer to function as a fan control device, and the program includes instructions for causing the computer to function as:

a rotation number deciding unit for deciding a rotation number of a cooling fan based on a result of detection by an intake air temperature sensor detecting intake air temperature;

a determining unit for determining whether a degree of increase of intake air temperature is equal to or more than a first threshold based on the result of detection by the intake air temperature sensor; and a controlling unit for, in a case where the determining unit determines that the degree of increase of intake air temperature is equal to or more than the first threshold, correcting the rotation number decided by the rotation number deciding unit, based on the result of detection by the intake air temperature sensor and a result of detection by an intake air humidity sensor detecting intake air humidity, and causing the cooling fan to rotate at the corrected rotation number.

According to the present invention, it is possible to produce an effect that occurrence of condensation can be prevented in a case where the temperature of intake air sharply increases.

EXEMPLARY EMBODIMENT

Figure 1:
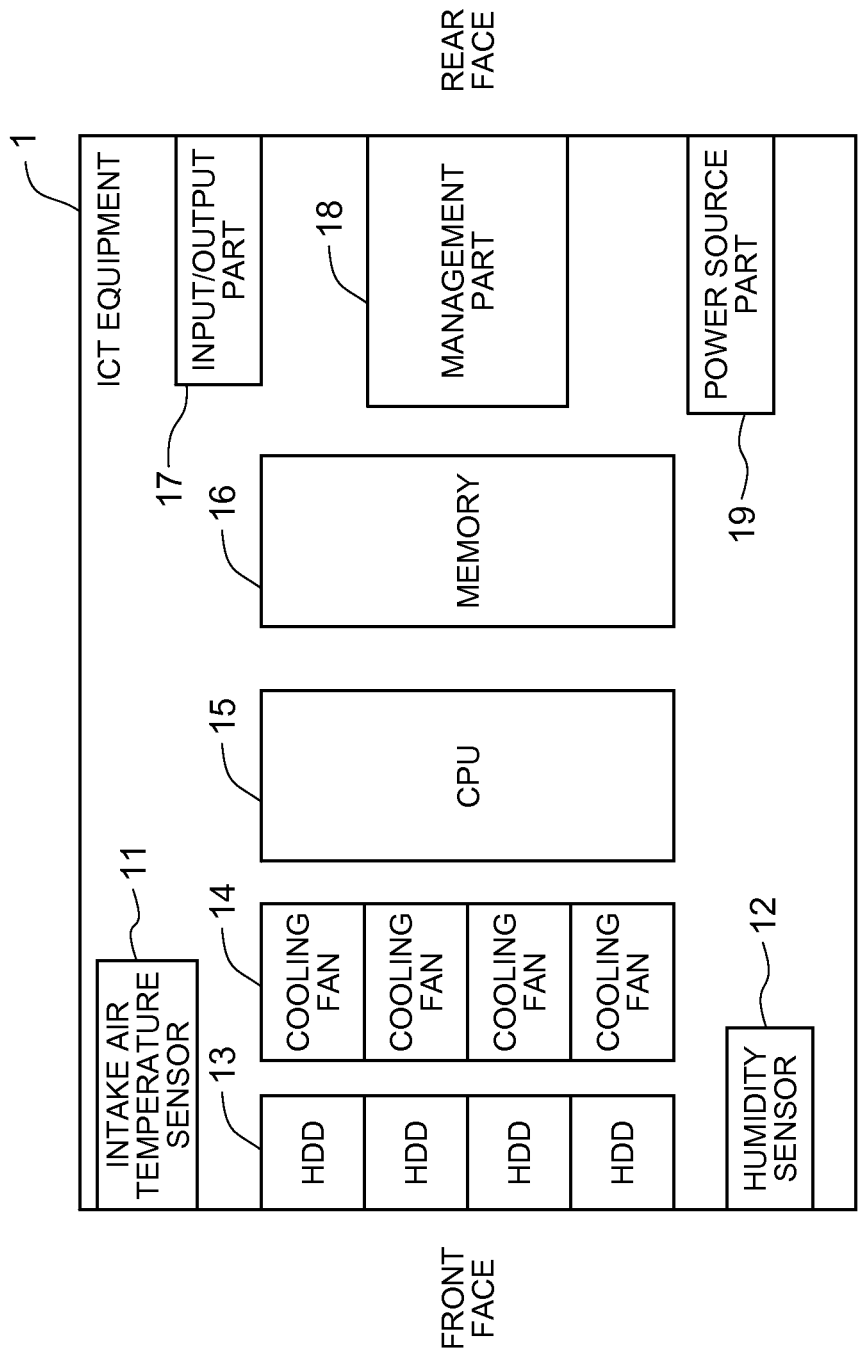
FIG. 1 is a block diagram showing an example of the configuration of ICT equipment 1 according to a first exemplary embodiment of the present invention.

Next, an exemplary embodiment of the present invention will be described in detail referring to the drawings.

First Exemplary Embodiment of Present Invention

Referring to FIG. 1, ICT equipment 1 according to a first exemplary embodiment of the present invention has, on the front side in a case thereof, an intake air temperature sensor 11 for detecting the temperature of intake air, an intake air humidity sensor 12 for detecting the humidity of intake air, and a plurality of hard disk drives (HDDs) 13. In the rear of the hard disk drives 13, a plurality of cooling fans 14 are placed and, in the rear of the cooling fans 14, a CPU 15 generating much heat and a memory 16 are placed. Moreover, on the rear side in the case, an input/output part 17 such as a network card, a management part 18 that is realized by a BMC (Base Management Controller) or the like and functions as a control device, and a power source part 19.

The management part 18 has a function of controlling the rotation number of the cooling fans 14. When the cooling fans 14 rotate, outside air is taken into the case through an inlet opening (not shown) formed on the front face of the case. The outside air taken into the case flows toward the rear face of the case and is exhausted through an outlet opening (not shown) formed on the rear face of the case.

Figure 2:
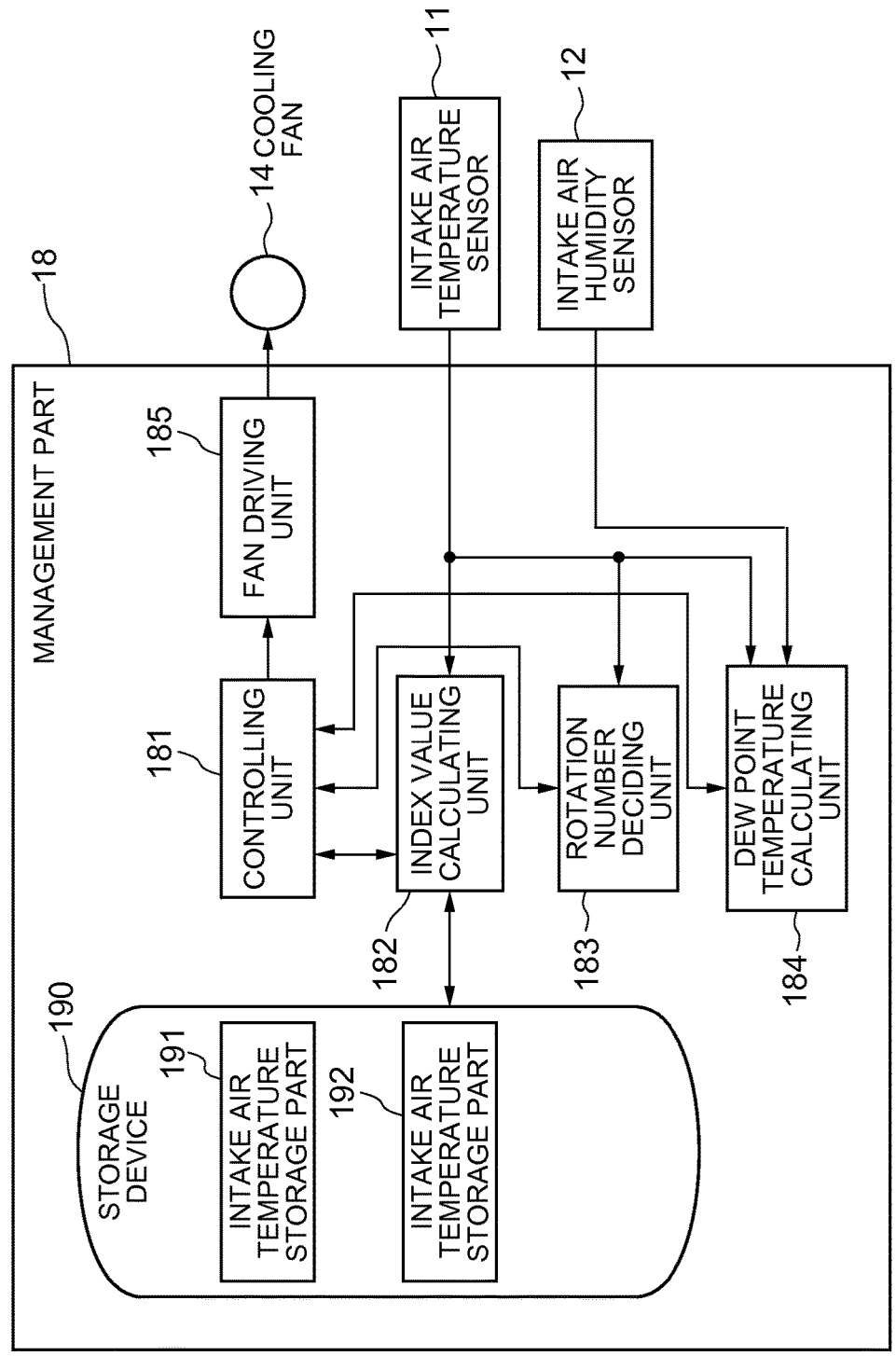
FIG. 2 is a block diagram showing an example of the configuration of a management part 18.

Referring to FIG. 2, the management part 18 includes a controlling unit 181, an index value calculating unit 182, a rotation number deciding unit 183, a dew point temperature calculating unit 184, a fan driving unit 185, and a storage device 190. The storage device 190 includes intake air temperature storage parts 191 and 192.

The controlling unit 181 has a function of outputting an index value calculation instruction to the index value calculating unit 182 every given time t1. The controlling unit 181 also has a function of outputting a rotation number decision instruction to the rotation number deciding unit 183. The controlling unit 181 also has a function of outputting a dew point temperature calculation instruction to the dew point temperature calculating unit 184. The controlling unit 181 also has a function of correcting the rotation number of the cooling fans 14 decided by the rotation number deciding unit 183. The controlling unit 181 also has a function of notifying the rotation number of the cooling fan 14 to the fan driving unit 185.

The index value calculating unit 182 has a function of calculating an index value showing the degree and direction of change of intake air temperature in response to an index value calculation instruction inputted every given time t from the controlling unit 181. To be more specific, when receiving input of an index value calculation instruction, the index value calculating unit 182 inputs intake air temperature T1 a given time t1 before recorded in the intake air temperature storage part 191, and also inputs current intake air temperature T2 detected by the intake air temperature sensor 11. Then, the index value calculating unit 182 calculates a difference $\Delta T=T2-T1$ between the intake air temperature T1 and the intake air temperature T2, and notifies the difference as an index value to the controlling unit 181. The absolute value of the difference $\Delta T$ shows the degree of change of intake air temperature, and the sign (+, −) shows the direction of the change. After that, the index value calculating unit 182 rewrites the intake air temperature recorded in the intake air temperature storage part 192 with the intake air temperature recorded in the intake air temperature storage part 191, and rewrites the intake air temperature recorded in the intake air temperature storage part 191 with the result of detection by the intake air temperature sensor 11.

The rotation number deciding unit 183 has a function of, when receiving input of a rotation number decision instruction from the controlling unit 181, deciding the rotation number of the cooling fans 14 based on intake air temperature detected by the intake air temperature sensor 11 and notifying the decided rotation number to the controlling unit 181.

The dew point temperature calculating unit 184 has a function of, when receiving input of a dew point temperature calculation instruction from the controlling unit 181, calculating a dew point temperature based on intake air temperature detected by the intake air temperature sensor 11 and intake air humidity detected by the intake air humidity sensor 12, and notifies the calculated dew point temperature to the controlling unit 181.

The fan driving unit 185 has a function of causing the cooling fans 14 to rotate at the rotation number specified by the controlling unit 181.

The controlling unit 181, the index value calculating unit 182, the rotation number deciding unit 183 and the dew point temperature calculating unit 184 can be realized by the CPU and, in this case, are realized in the following manner, for example. A disk, a semiconductor memory, or another recording medium storing a program for causing the CPU to function as the respective units 181 to 184 is prepared, and the CPU is caused to read the program. The CPU realizes the respective units 181 to 184 thereon by controlling its own operation in accordance with the read program.

Operation in First Exemplary Embodiment

Figure 3:
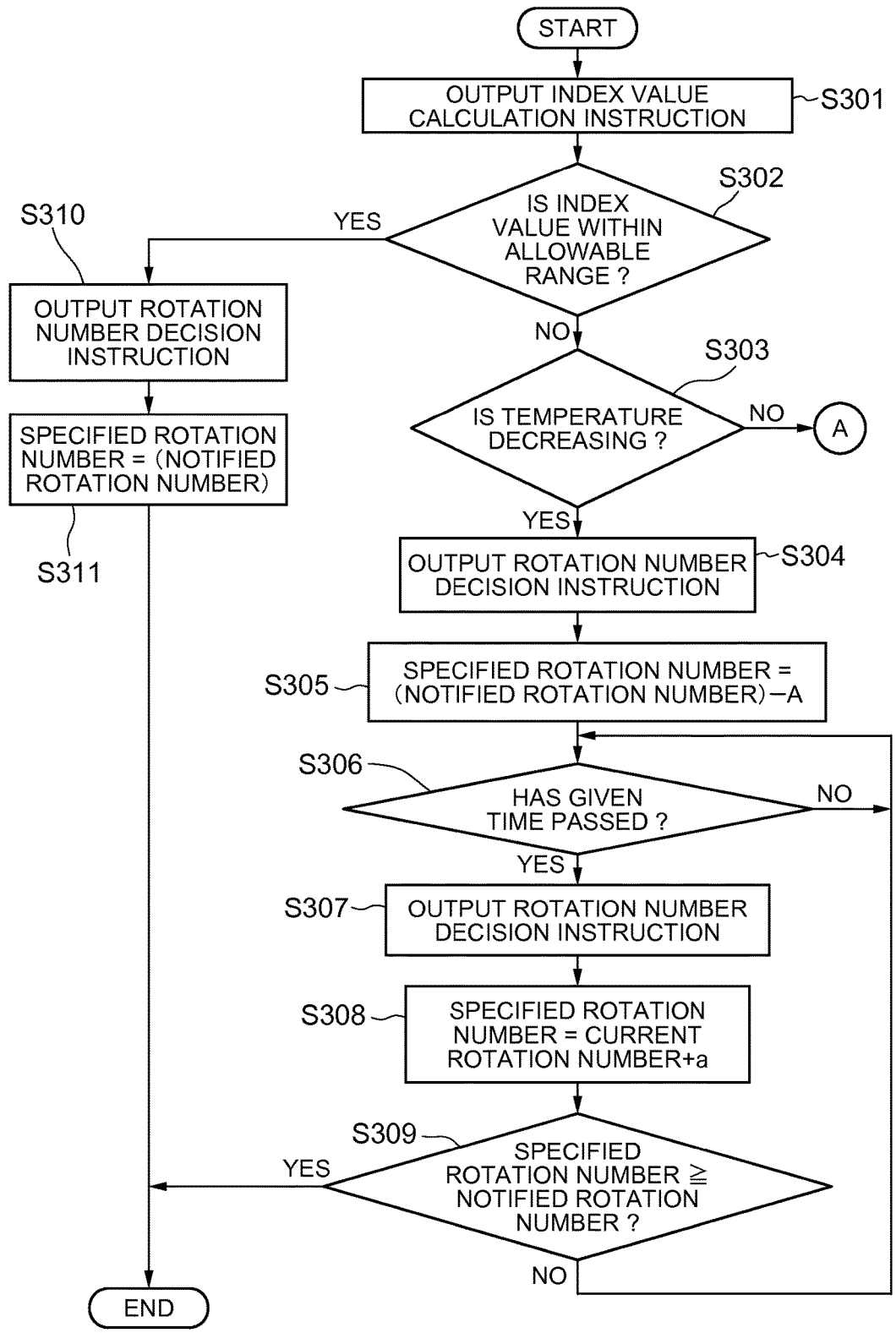
FIG. 3 is a flowchart showing an example of processing by a controlling unit 181 in a case where intake air temperature sharply decreases.
Figure 4:
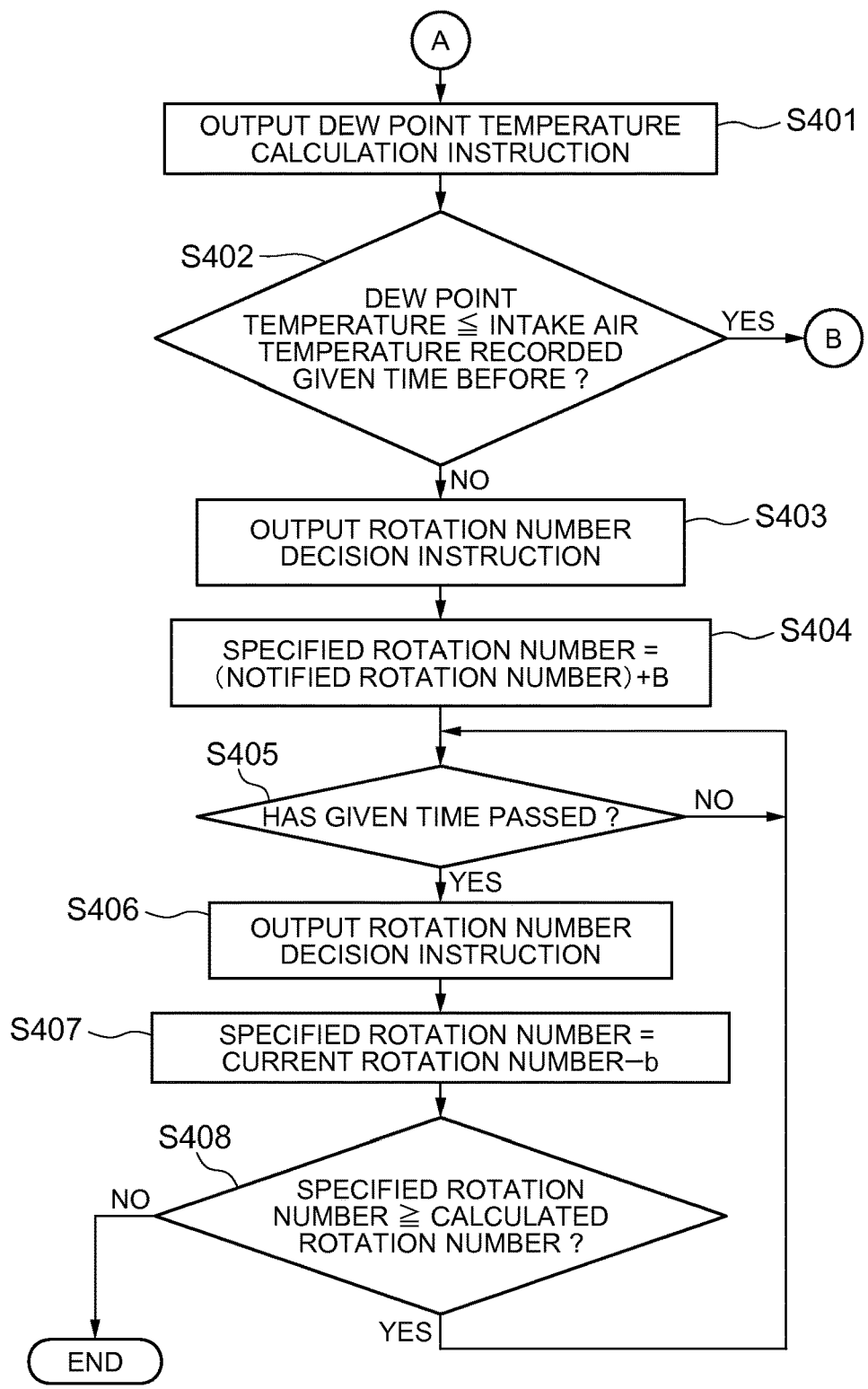
FIG. 4 is a flowchart showing an example of processing by the controlling unit 181 in a case where intake air temperature sharply increases and there is a risk of occurrence of condensation.
Figure 5:
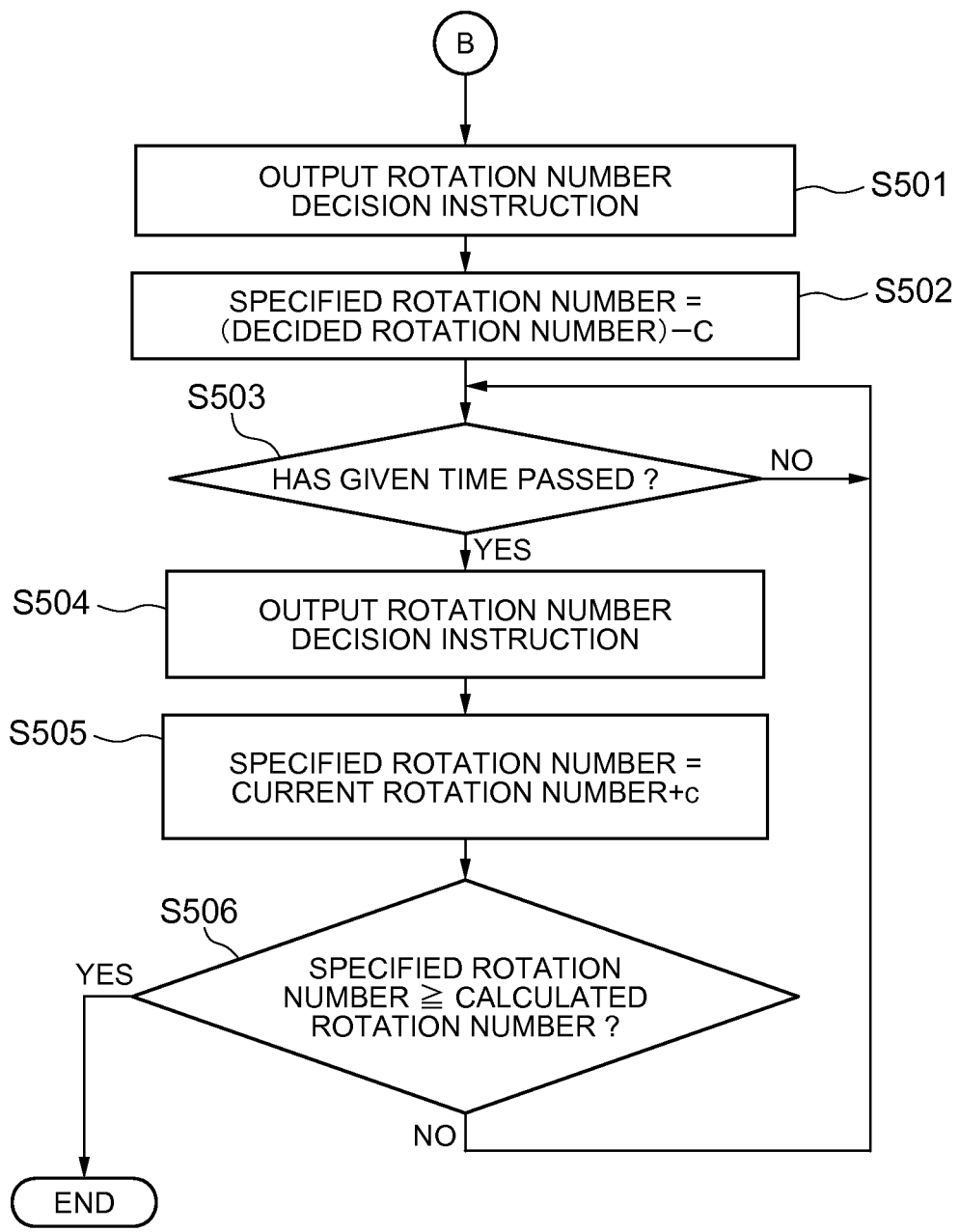
FIG. 5 is a flowchart showing an example of processing by the controlling unit 181 in a case where intake air temperature air sharply increases but there is no risk of occurrence of condensation.

Next, an operation in this exemplary embodiment will be described in detail referring to FIGS. 3 to 5. FIGS. 3 to 5 are flowcharts showing an operation in an example of processing by the controlling unit 181.

The controlling unit 181 executes processing shown in FIGS. 3 to 5 every given time t1 (e.g., every 30 minutes). First, as shown in FIG. 3, the controlling unit 181 outputs an index value calculation instruction to the index value calculating unit 182 (step S301). Thus, the index value calculating unit 182 receives input of the intake air temperature T1 the given time t1 before recorded into the intake air temperature storing unit 191 and input of the current intake air temperature T2 detected by the intake air temperature sensor 11, and calculates the difference $\Delta T=T2-T1$ between the intake air temperature T1 and the intake air temperature T2. Then, the index value calculating unit 182 passes the calculated difference $\Delta T$ as an index value to the controlling unit 181. After that, the index value calculating unit 182 replaces intake air temperature recorded in the intake air temperature storage part 192 with intake air temperature recorded in the intake air temperature storage part 191, and also changes the intake air temperature T1 recorded in the intake air temperature storage part 191 to the current intake air temperature T2.

Upon receiving the index value $\Delta T$, the controlling unit 181 determines whether the value is within an allowable range or not (step S302). That is to say, the controlling unit 181 determines whether the degree of change of intake air temperature is within the allowable range or not.

In a case where the index value $\Delta T$ is within the allowable range (Yes in step S302), the controlling unit 181 outputs a rotation number decision instruction to the rotation number deciding unit 183 (step S310). Thus, the rotation number deciding unit 183 decides the rotation number of the cooling fans 14 based on the intake air temperature detected by the intake air temperature sensor 11, and notifies the decided rotation number to the controlling unit 181. As a method for deciding the rotation number, it is possible to employ, for example, setting the rotation number to "0" when intake air temperature is less than a lower limit value THmin of an operation guaranteed temperature range (a temperature range in which the ICT equipment can operate) specified for the ICT equipment 1, setting the rotation number to "K1" when THmin≤intake air temperature≤TH1, setting the rotation number to "K2" when TH1<intake air temperature≤an upper limit value THmax of the operation guaranteed temperature range, and setting the rotation number to "K3" when THmax<intake air temperature (0<K1<K2<K3). The method for deciding the rotation number of the cooling fans 14 is not limited to the abovementioned method, and the rotation number of the cooling fans 14 may be decided by also considering the utilization status of the ICT equipment 1 represented by power consumption of the ICT equipment 1, load on the CPU 15, and so on. To be more specific, as the utilization rate of the ICT equipment 1 is higher, the rotation number calculated based on intake air temperature is corrected so that the corrected rotation number becomes higher.

Upon receiving notification of the rotation number from the rotation number deciding unit 183, the controlling unit 181 instructs the fan driving unit 185 to rotate the cooling fans 14 at the notified rotation number (step S311).

On the other hand, in a case where the index value $\Delta T$ is out of the allowable range (No in step S302), the controlling unit 181 determines whether the intake air temperature is decreasing or increasing based on the index value $\Delta T$ (step S303). To be specific, the controlling unit 181 determines that the intake air temperature is decreasing in a case where the sign of the index value $\Delta T$ is "−," whereas the controlling unit 181 determines that the intake air temperature is increasing in a case where the sign of the index value $\Delta T$ is "+."

When determining that the intake air temperature is decreasing (Yes in step S303), the controlling unit 181 outputs a rotation number decision instruction to the rotation number deciding unit 183 (step S304). Thus, the rotation number deciding unit 183 decides the rotation number of the cooling fans 14 based on the result of detection by the intake air temperature sensor 11, and notifies the decided rotation number to the controlling unit 181.

When receiving notification of the rotation number, for example, K1 from the rotation number deciding unit 183, the controlling unit 181 calculates a rotation number (K1−A) that is lower than K1 by a rotation number A, and instructs the fan driving unit 185 to rotate the cooling fans 14 at the rotation number (K1−A) (step S305). The rotation number A can be set to, for example, a value that is about 10% to 20% of the rotation number K1 detected by the rotation number deciding unit 183. To be specific, in a case where the rotation number A is set to 10% of the rotation number K1, the controlling unit 181 instructs the fan driving unit 185 to rotate the cooling fans 14 at a rotation number 0.9×K1. Herein, the rotation number of the cooling fans 14 is set to the rotation number lower than the rotation number calculated by the rotation number deciding unit 183, for the purpose of preventing the temperature inside the ICT equipment 1 from sharply decreasing. That is to say, the ICT equipment 1 is made of various kinds of materials such as metal and plastic and, in a case where the temperature sharply decreases, a difference of expansion coefficient among the various kinds of materials generates stress, which leads to easy occurrence of a trouble such as a fracture of a joint face between the different kinds of materials. Accordingly, in this exemplary embodiment, by setting the rotation number of the cooling fans 14 to a lower rotation number than the rotation number calculated by the rotation number deciding unit 183, sharp decrease of the temperature inside the ICT equipment 1 is prevented.

After that, the controlling unit 181 waits until a given time t2 (e.g., about two minutes) passes (step S306). When the given time t2 passes (Yes in step S306), the controlling unit 181 outputs a rotation number decision instruction to the rotation number deciding unit 183 (step S307). Thus, the rotation number deciding unit 183 decides the rotation number of the cooling fans 14 based on the result of detection by the intake air temperature sensor 11, and notifies the decided rotation number to the controlling unit 181.

When receiving notification of the rotation number, the controlling unit 181 calculates a rotation number (K1−A+a) that is higher by a than the current rotation number (K1−A) of the cooling fans, and instructs the fan driving unit 185 to rotate the cooling fans 14 at the rotation number (K1−A+a) (step S308). The value of a can be set to about 10% of the value of A. After that, the controlling unit 181 compares the rotation number (K1−A+a) specified thereby to the fan driving unit 185 with the rotation number notified by the rotation number deciding unit 183 (step S309).

In a case where the rotation number specified thereby to the fan driving unit 185 is lower than the rotation number notified by the rotation number deciding unit 183 (No in step S309), the controlling unit 181 again executes the processing from step S306. Then, the controlling unit 181 sets a rotation number to be instructed to the fan driving unit 185, to a rotation number (K1−A+2a) that is higher by a than the current rotation number. On the other hand, in a case where the rotation number specified thereby to the fan driving unit 185 is equal to or more than the rotation number notified by the rotation number deciding unit 183 (Yes in step S309), the controlling unit 181 ends the processing. Thus, by gradually raising the rotation number of the cooling fans 14 by "a," it is possible to prevent the temperature inside the ICT equipment 1 from sharply decreasing, and consequently, it is possible to prevent occurrence of a breakdown.

That is the operation when intake air temperature sharply decreases. Next, an operation when intake air temperature sharply increases will be described.

When intake air temperature sharply increases, the result of determination in step S303 of FIG. 3 is "No," and processing in step S401 of FIG. 4 is executed.

In step S401 of FIG. 4, the controlling unit 181 outputs a dew point temperature calculation instruction to the dew point temperature calculating unit 184. Thus, the dew point temperature calculating unit 184 calculates a dew point temperature based on the intake air temperature detected by the intake air temperature sensor 11 and the intake air humidity detected by the intake air humidity sensor 12, and notifies the calculated dew point temperature to the controlling unit 181.

The controlling unit 181 compares the notified dew point temperature with the intake air temperature the given time t1 before recorded in the intake air temperature storage part 192, thereby determining whether there is a risk of occurrence of condensation or not (step S402).

In the case of determining that there is no risk of occurrence of condensation, that is, in a case where the dew point temperature is higher than the intake air temperature recorded in the intake air temperature storage part 192 (No in step S402), the controlling unit 181 outputs a rotation number decision instruction to the rotation number deciding unit 183 (step S403). Thus, the rotation number deciding unit 183 calculates the rotation number of the cooling fans 14 based on the result of detection by the intake air temperature sensor 11, and notifies the calculated rotation number to the controlling unit 181.

When receiving notification of the rotation number, for example, K1 from the rotation number deciding unit 183, the controlling unit 181 calculates a rotation number (K1+B) that is higher than K1 by a rotation number B, and instructs the fan driving unit 185 to rotate the cooling fans 14 at the rotation number (K1+B) (step S404). The rotation number B can be set to, for example, a value that is about 10% to 20% of the rotation number K1 detected by the rotation number deciding unit 183. Herein, the rotation number of the cooling fans 14 is set to a rotation number that is higher than the rotation number decided by the rotation number deciding unit 183, for the purpose of preventing the temperature inside the ICT equipment 1 from sharply increasing, and preventing occurrence of breakdown due to heat stress After that, the controlling unit 181 waits until the given time t2 passes (step S405). When the given time t2 passes (Yes in step S405), the controlling unit 181 outputs a rotation number decision instruction to the rotation number deciding unit 183 (step S406). Thus, the rotation number deciding unit 183 decides the rotation number of the cooling fans 14 based on the result of detection by the intake air temperature sensor 11, and notifies the decided number of rotations to the controlling unit 181.

When receiving notification of the rotation number, the controlling unit 181 calculates a rotation number (K1+B−b) that is lower by b than the current rotation number (K1+B) of the cooling fans, and instructs the fan driving unit 185 to rotate the cooling fans 14 at the rotation number (K1+B−b) (step S407). The value of b can be set to about 10% of the value of B. After that, the controlling unit 181 compares the rotation number (K1+B−b) specified thereby to the fan driving unit 185 with the rotation number notified from the rotation number deciding unit 183 (step S408).

In a case where the rotation number specified to the fan driving unit 185 is equal to or more than the rotation number notified by the rotation number deciding unit 183 (Yes in step S408), the controlling unit 181 again executes the processing from step S405. Then, the controlling unit 181 sets a rotation number to be specified thereby to the fan driving unit 185, to a rotation number (K1+B−2b) that is lower than the current rotation number by b. On the other hand, in a case where the rotation number instructed to the fan driving unit 185 is less than the rotation number notified by the rotation number deciding unit 183 (No in step S408), the controlling unit 181 ends the processing. Thus, by gradually lowering the rotation number of the cooling fans 14 by "b," it is possible to prevent the temperature inside the ICT equipment 1 from sharply decreasing, and consequently, it is possible to prevent occurrence of a breakdown.

In the case of determining that there is a risk of occurrence of condensation in step S402 (Yes in step 402), the controlling unit 181 executes processing in step S501 of FIG. 5. In step S501, the controlling unit 181 outputs a rotation number decision instruction to the rotation number deciding unit 183. Thus, the rotation number deciding unit 183 decides the rotation number of the cooling fans 14 based on the result of detection by the intake air temperature sensor 11, and passes the decided number of rotations to the controlling unit 181.

When receiving notification of the rotation number, for example, K1 from the rotation number deciding unit 183, the controlling unit 181 calculates a rotation number (K1−C) that is lower than K1 by a rotation number C, and instructs the fan driving unit 185 to rotate the cooling fans 14 at the rotation number (K1−C) (step S502). The rotation number C can be set to, for example, a value that is about 10% to 20% of the rotation number K1 detected by the rotation number deciding unit 183. Herein, the rotation number of the cooling fans 14 is set to a lower rotation number than the rotation number calculated by the rotation number deciding unit 183, for the purpose of preventing occurrence of condensation.

After that, the controlling unit 181 waits until the given time t2 passes (step S503). When the given time t2 passes (Yes in step S503), the controlling unit 181 outputs a rotation number decision instruction to the rotation number deciding unit 183 (step S504). Thus, the rotation number deciding unit 183 decides the rotation number of the cooling fans 14 based on the result of detection by the intake air temperature sensor 11, and notifies the decided number of rotations to the controlling unit 181.

When receiving notification of the rotation number, the controlling unit 181 calculates a rotation number (K1−C+c) that is higher by c than the current rotation number (K1−C) of the cooling fans, and instructs the fan driving unit 185 to rotate the cooling fans 14 at the rotation number (K1−C+c) (step S505). The value of c can be set to about 10% of the value of C. After that, the controlling unit 181 compares the rotation number (K1−C+c) specified thereby to the fan driving unit 185 with the rotation number notified from the rotation number deciding unit 183 (step S506).

In a case where the rotation number instructed to the fan driving unit 185 is less than the rotation number notified by the rotation number deciding unit 183 (No in step S506), the controlling unit 181 again executes the processing from step S503. Then, the controlling unit 181 sets a rotation number to be specified thereby to the fan driving unit 185, to a rotation number (K1−C+2c) that is lower by c than the current rotation number. On the other hand, in a case where the rotation number specified to the fan driving unit 185 is equal to or more than the rotation number notified by the rotation number deciding unit 183 (No in step S506), the controlling unit 181 ends the processing. Thus, by gradually raising the rotation number of the cooling fans 14 by "c," it is possible to prevent the temperature inside the ICT equipment 1 from sharply decreasing, and consequently, it is possible to prevent occurrence of a breakdown.

The index value is the quantity of change of intake air temperature per unit time in the exemplary embodiment described above, but is not limited to this. For example, the index value may be the average of rates of change of intake air temperature in a plurality of measurement periods. Moreover, the intake air temperature sensor 11 and the intake air humidity sensor 12 are placed within the case of the ICT equipment in the exemplary embodiment, but may be placed outside the case.

Effect of First Exemplary Embodiment

According to this exemplary embodiment, it is possible to produce an effect that occurrence of condensation can be prevented even when intake air temperature sharply increases. This is because the cooling fans are caused to rotate at a lower rotation number than a rotation number decided based on outside temperature, in a case where intake air temperature sharply increases and there is a risk of occurrence of condensation.

Further, according to this exemplary embodiment, it is possible to prevent occurrence of breakdown due to heat stress. This is because the cooling fans are caused to rotate at a lower rotation number than a rotation number decided based on outside temperature in a case where intake air temperature sharply decreases, whereas the cooling fans are caused to rotate at a higher rotation number than a rotation number decided based on intake air temperature in a case where intake air temperature sharply increases but there is no risk of occurrence of condensation.

Second Exemplary Embodiment of Present Invention

Figure 6:
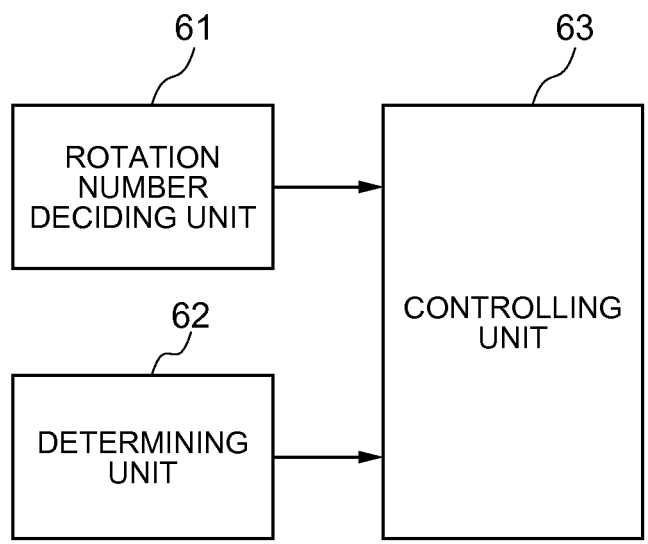
FIG. 6 is a block diagram showing an example of the configuration of a fan control device according to a second exemplary embodiment of the present invention.

Next, a second exemplary embodiment of the present invention will be described. Referring to FIG. 6, a fan control device according to this exemplary embodiment includes a rotation number deciding unit 61, a determining unit 62, and a controlling unit 63.

The rotation number deciding unit 61 decides the rotation number of cooling fans based on the result of detection by an intake air temperature sensor for detecting intake air temperature.

The determining unit 62 determines whether the degree of increase of intake air temperature is equal to or more than a first threshold based on the result of detection by the intake air temperature sensor.

When the determining unit 62 determines that the degree of increase of the intake air temperature is equal to or more than the first threshold, the controlling unit 63 corrects the rotation number decided by the rotation number deciding unit 61, based on the result of detection by the intake air temperature sensor and the result of detection by an intake air humidity sensor for detecting intake air humidity, and causes the cooling fans to rotate at the corrected rotation number. For example, the determining unit 62 determines whether there is a possibility of occurrence of condensation based on the result of detection by the intake air temperature sensor and the result of detection by the intake air humidity sensor and, when determining that there is a possibility of occurrence of condensation, performs correction to decrease the rotation number on the rotation number decided by the rotation number deciding unit 61.

The present invention may be ICT equipment having a configuration described below in a like manner as the fan control device.

ICT equipment includes:
 a cooling fan;
 an intake temperature sensor detecting intake air temperature;

an intake air humidity sensor detecting intake air humidity;

a rotation number deciding unit for deciding a rotation number of the cooling fan based on a result of detection by the intake air temperature sensor;

a determining unit for determining whether a degree of increase of intake air temperature is equal to or more than a first threshold based on the result of detection by the intake air temperature sensor; and a controlling unit for, in a case where the determining unit determines that the degree of increase of intake air temperature is equal to or more than the first threshold, correcting the rotation number decided by the rotation number deciding unit, based on the result of detection by the intake air temperature sensor and a result of detection by the intake air humidity sensor, and causing the cooling fan to rotate at the corrected rotation number.

Further, the present invention may be a fan control method including operations described below.

A fan control method includes:

deciding a rotation number of a cooling fan based on a result of detection by an intake air temperature sensor detecting intake air temperature, by a rotation number deciding unit;

determining whether a degree of increase of intake air temperature is equal to or more than a first threshold based on the result of detection by the intake air temperature sensor, by a determining unit; and in a case where the determining unit determines that the degree of increase of intake air temperature is equal to or more than the first threshold, correcting the rotation number decided by the rotation number deciding unit, based on the result of detection by the intake air temperature sensor and a result of detection by an intake air humidity sensor detecting intake air humidity, and causing the cooling fan to rotate at the corrected rotation number, by a controlling unit.

Further, the present invention may be a non-transitory computer-readable medium storing a program including instructions for causing a computer to function as a fan control device in a manner described below.

A non-transitory computer-readable medium stores a program including instructions for causing a computer to function as:

a rotation number deciding unit for deciding a rotation number of a cooling fan based on a result of detection by an intake air temperature sensor detecting intake air temperature;

a determining unit for determining whether a degree of increase of intake air temperature is equal to or more than a first threshold based on the result of detection by the intake air temperature sensor; and a controlling unit for, in a case where the determining unit determines that the degree of increase of intake air temperature is equal to or more than the first threshold, correcting the rotation number decided by the rotation number deciding unit, based on the result of detection by the intake air temperature sensor and a result of detection by an intake air humidity sensor detecting intake air humidity, and causing the cooling fan to rotate at the corrected rotation number.

Effect of Second Exemplary Embodiment

According to this exemplary embodiment, it is possible to produce an effect that occurrence of condensation can be prevented even when intake air temperature sharply increases. This is because, in a case where intake air temperature sharply increases and there is a risk of occurrence of condensation, the rotation number decided based on intake air temperature is corrected and the cooling fans are caused to rotate at the corrected rotation number.

Further, in the fan control device, the controlling unit may be configured to, when determining that there is no possibility of occurrence of condensation, correct the rotation number decided by the rotation number deciding unit so as to increase the rotation number.

Further, in the fan control device:

the determining unit may be configured to determine whether a degree of decrease of intake air temperature is equal to or more than a second threshold based on the result of detection by the intake air temperature sensor; and the controlling unit may be configured to, in a case where the determining unit determines that the degree of decrease of intake air temperature is equal to or more than the second threshold, correct the rotation number decided by the rotation number deciding unit so as to decrease the rotation number.

Further, in the fan control device, the controlling unit may be configured to, after correcting the rotation number decided by the rotation number deciding unit so as to decrease the rotation number, gradually increase the rotation number of the cooling fan until the rotation number of the cooling fan becomes the rotation number decided by the rotation number deciding unit.

Further, in the fan control device, the controlling unit may be configured to, after correcting the rotation number decided by the rotation number deciding unit so as to increase the rotation number, gradually decrease the rotation number of the cooling fan until the rotation number of the cooling fan becomes the rotation number decided by the rotation number deciding unit.

The present invention is described above referring to the exemplary embodiments and so on, but is not limited to the exemplary embodiments. The configurations and details of the present invention can be modified within the scope of the present invention in various manners that can be understood by one skilled in the art.

The invention claimed is:

1. A fan control device for controlling an air cooling fan that directs outside air into an electrical apparatus, the fan control device comprising:

a rotation number deciding unit configured to decide a rotation number of the air cooling fan based on a result of detection by an intake air temperature sensor detecting an intake air temperature;

a determining unit configured to perform a determination whether an amount of change of the intake air temperature during a predetermined period is equal to or greater than a first threshold amount of change of the intake air temperature during the predetermined period, the determination based on the result of detection by the intake air temperature sensor; and a controlling unit configured, in a case in which the determining unit determines that the amount of change is equal to or greater than the first threshold amount of change of the intake air temperature, to correct the rotation number decided by the rotation number deciding unit, based on the result of detection by the intake air temperature sensor and a result of detection by an intake air humidity sensor detecting an intake air humidity, and causing the air cooling fan to rotate at the corrected rotation number, wherein the controlling unit is further configured, after correcting the rotation number decided by the rotation number deciding unit so as to decrease the rotation number, to gradually increase the rotation number of the air cooling fan until the rotation number of the air cooling fan becomes the rotation number decided by the rotation number deciding unit.

2. A fan control device for controlling an air cooling fan that directs outside air into an electrical apparatus, the fan control device comprising:
   a rotation number deciding unit configured to decide a rotation number of the air cooling fan based on a result of detection by an intake air temperature sensor detecting an intake air temperature;
   a determining unit configured to perform a determination whether an amount of change of the intake air temperature during a predetermined period is equal to or greater than a first threshold amount of change of the intake air temperature during the predetermined period, the determination based on the result of detection by the intake air temperature sensor; and
   a controlling unit configured, in a case in which the determining unit determines that the amount of change is equal to or greater than the first threshold amount of change of the intake air temperature, to correct the rotation number decided by the rotation number deciding unit, based on the result of detection by the intake air temperature sensor and a result of detection by an intake air humidity sensor detecting an intake air humidity, and causing the air cooling fan to rotate at the corrected rotation number,
   wherein the controlling unit is further configured, after correcting the rotation number decided by the rotation number deciding unit so as to increase the rotation number, to gradually decrease the rotation number of the air cooling fan until the rotation number of the air cooling fan becomes the rotation number decided by the rotation number deciding unit.

3. A fan control device for controlling an air cooling fan that directs outside air into an electrical apparatus, the fan control device comprising:
   a rotation number deciding unit configured to decide a rotation number of the air cooling fan based on a result of detection by an intake air temperature sensor detecting an intake air temperature;
   a determining unit configured to perform a determination whether an amount of change of the intake air temperature during a predetermined period is equal to or greater than a first threshold amount of change of the intake air temperature during the predetermined period, the determination based on the result of detection by the intake air temperature sensor; and
   a controlling unit configured, in a case in which the determining unit determines that the amount of change is equal to or greater than the first threshold amount of change of the intake air temperature, to correct the rotation number decided by the rotation number deciding unit, based on the result of detection by the intake air temperature sensor and a result of detection by an intake air humidity sensor detecting an intake air humidity, and causing the air cooling fan to rotate at the corrected rotation number, wherein
   the controlling unit is further configured, in a first case in which the determining unit determines that the amount of change represents an increase in temperature and in which the determining unit determines that the intake air humidity represents a first risk of condensation below a first threshold of condensation, to set the corrected rotation number such that a rotation of the air cooling fan is increased by a first amount and subsequently decreased by a second amount smaller than the first amount after a first predetermined amount of time, and
   the controlling unit is further configured, in a second case in which the determining unit determines that the amount of change represents a decrease in temperature and in which the determining unit determines that the intake air humidity represents a second risk of condensation above a second threshold of condensation higher, to set the corrected rotation number such that the rotation of the air cooling fan is decreased by a third amount and subsequently increased by a fourth amount smaller than the third amount after a second predetermined amount of time.

4. The fan control device according to claim 3, wherein the first risk of condensation represents a lower risk of condensation than the second risk of condensation.

* * * * *